United States Patent [19]

Fujioka

[11] Patent Number: 4,972,167

[45] Date of Patent: Nov. 20, 1990

[54] ELECTRIC NOISE ABSORBER

[75] Inventor: Akio Fujioka, Ichikawa, Japan

[73] Assignee: Kitagawa Industries Co., Ltd., Japan

[21] Appl. No.: 475,165

[22] Filed: Feb. 5, 1990

[30] Foreign Application Priority Data

Feb. 17, 1989 [JP] Japan ............................. 1-18284[U]

[51] Int. Cl.$^5$ ..................... H01F 17/06; H01F 27/02; H01F 27/26
[52] U.S. Cl. ........................................ 336/92; 174/92; 324/127; 333/12; 336/175; 336/176; 336/212
[58] Field of Search ............. 174/92, 52.1, 50; 324/127; 333/12, 81 R, 182, 243, 183; 336/92, 174, 175, 176, 212, 210, 90

[56] References Cited

U.S. PATENT DOCUMENTS 4,882,561 11/1989 Fujioka ......................... 336/175 X

FOREIGN PATENT DOCUMENTS 63-39997 3/1988 Japan ................................. 336/175

Primary Examiner—Thomas J. Kozma
Attorney, Agent, or Firm—Oliff & Berridge

[57] ABSTRACT

An electric noise absorber for absorbing electric noise on an electronic device, comprising a piece or pieces of ferrite and an openable case composed of a pair of case members for containing the piece or pieces of ferrite, keeps the electric cable in position by means of two pairs of holding members, and also holds the cable loosely at openings formed in both ends of the case members. The electric cable is prevented from being damaged because the cable is not bent sharply in the vicinity of the openings. The piece or pieces of ferrite is or are attached to or detached from the case members easily owing to the elasticity of the holding members. Moreover, the electric noise absorber is installed on the electric cable simply by being placed at an appropriate position and being closed by means of a pair of protrusion and a pair of hooks provided on the two case members, respectively.

8 Claims, 5 Drawing Sheets 4,972,167

1

ELECTRIC NOISE ABSORBER

BACKGROUND OF THE INVENTION

This invention relates to an electric noise absorber that is put around an electric cable of an electronic device so as to prevent electric noise generated in the outside from entering into the electronic device via the electric cable.

As a method to absorb electric noise on an electric cable, it is well-known that ferrite, as magnetic substance, fitted onto the electric cable absorbs the electric noise.

For example, Japan Published Unexamined Utility Model Application No. 63-39997 proposes a electric noise absorber comprising two pieces of axially divided half-cylindrical ferrite and a pair of plastic cases for accommodating the two pieces of ferrite respectively. The electric noise absorber, when installed on an electric cable, attenuates electric noise flowing on the electric cable.

However, the electric noise absorber has a problem. Specifically, since the electric cable is held by the electric noise absorber at the openings of the cases, the electric cable is bent in a sharp curve in the vicinity of the openings when external force is exerted on the electric cable. Thus the electric cable may be damaged or shortcircuited during use.

SUMMARY OF THE INVENTION

It is an object of this invention to provide an electric noise absorber that does not cause damage to an electric cable while the electric noise absorber is installed on the electric cable.

This object is realized by an electric noise absorber, comprising magnetic substance that is shaped to surround the periphery of an electric cable, and an openable case that is composed of two case members for containing the magnetic substance. When the case is fitted onto the electric cable of the electronic device, the electric noise absorber attenuates the electric noise on the electric cable. The case members are provided with a pair of holding members, for fixing the electric cable, extending from the bottoms of the case members toward the axis of the case. When the case is closed, abutment faces on adjacent holding members contact, and holes are formed in the holding members. At both ends of the case members, openings are defined through which the electric cable passes. The diameter of the openings is larger than that of the holes, which are surrounded by the abutment faces of the holding members.

The holding members, when made of elastic material including plastics, keep the electric cable securely, because the abutment faces are deformed to fit the periphery of the electric cable; in other words, the tips of the holding member are inclined in the axial direction of the electric cable and the abutment faces are moved in the direction orthogonal to the axis, or the abutment faces are widened along the periphery of the electric cable in the direction orthogonal to the axis.

Moreover, the holding members made of elastic material are preferable in that the holding members make it easier to attach the magnetic substance such as ferrite to the case or to detach the magnetic substance from the case.

Engaging projections, which are provided on the holding members and extend toward the inside of the

2 case in the axial direction, engage with the notches formed in the magnetic substance without difficulty, so that the magnetic substance is settled in the case members.

DETAILED DESCRIPTION OF PREFERRED EMBODIMENTS

Set forth is an explanation of embodiments of the present invention with reference to the attached drawings FIGS. 1 through 11.

Figure 1:
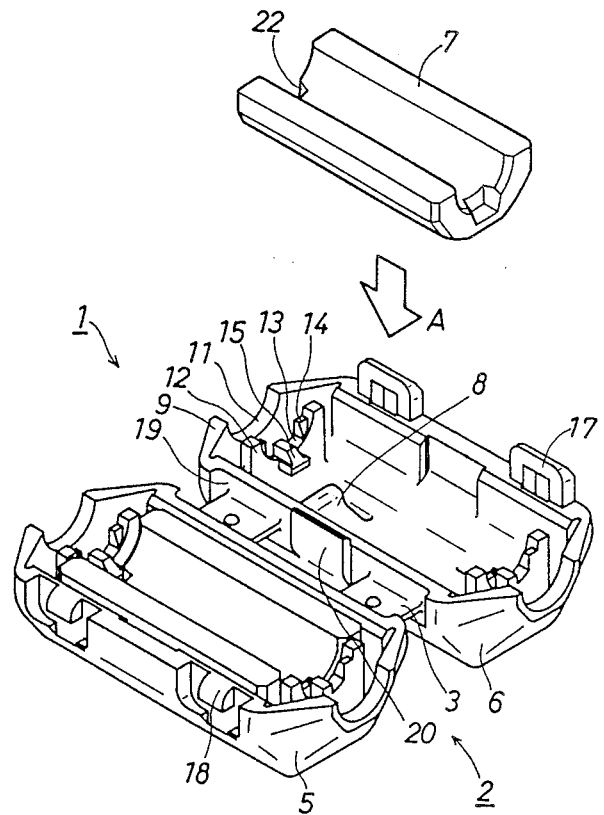
FIG. 1 is a perspective view of an electric noise absorber of a first embodiment.
Figure 2:
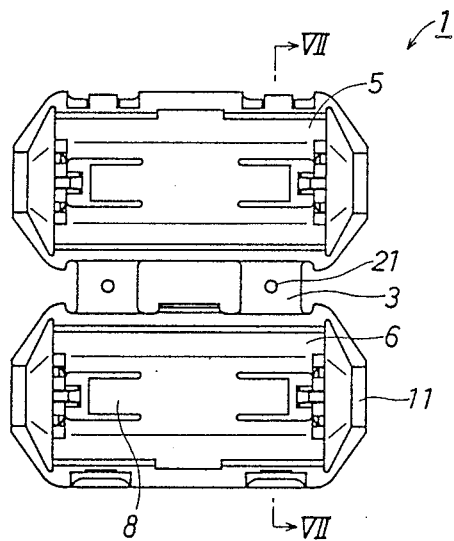
FIG. 2 is a plan view of a case of the electric noise absorber.

As shown in FIG. 1, a case 2 of an electric noise absorber 1 comprises boat-shaped case members 5 and 6 which are connected via a hinge 3, and two pieces of ferrite 7 contained in the case members 5 and 6. At each bottom of the case members 5 and 6 a pair of biasing members 8 made of elastic material projects upward so as to press the two pieces of ferrite against each other.

Figure 3:
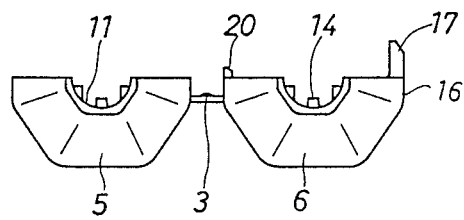
FIG. 3 is a left side view of the case shown in FIG. 2.
Figure 4:
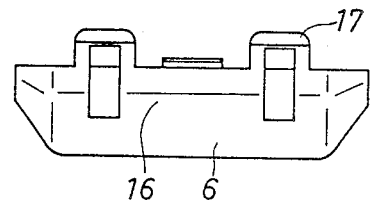
FIG. 4 is a front view of the case shown in FIG. 2.
Figure 5:
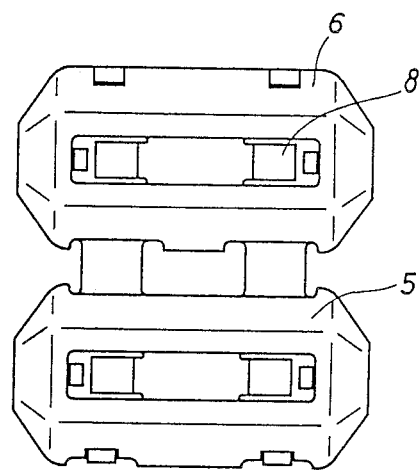
FIG. 5 is a bottom plan view of the case shown in FIG. 2.
Figure 6:
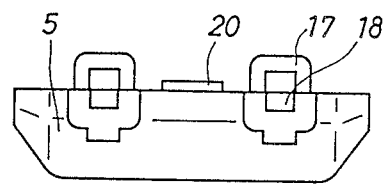
FIG. 6 is a rear view of the case shown in FIG. 2.
Figure 7:
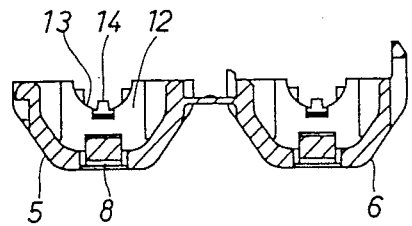
FIG. 7 is a cross-sectional view taken on line VII—VII in FIG. 2.

Semicircle openings 11 are provided in walls 9 at both ends of the case members 5 and 6. Inside of the openings 11 of each of the case members 5 and 6, a pair of holding members 12 extending toward the axis of the case 2 is provided so that the holding members 12 may be deformed in the longitudinal direction. Three teeth 14 are positioned on each of abutment faces 13 of the holding members 12, as shown in FIG. 3. A pair of engaging projections 15 is attached to the middle tooth of the three teeth 14 so as to be positioned opposite to each other. The engaging projections 15 engage with engaging notches 22 formed at both ends of the piece of ferrite 7.

A pair of hooks 17 is provided on the outer surface 16 of the case member 6 and a pair of protrusions 18 is provided on the outer surface of the case member 5. The pair of hooks 17 and the pair of protrusions 18 engage when the electric noise absorber 1 is closed. A plate 20 defined on another outer surface 19 opposite to the outer surface 16 enforces the engagement of the case members 5 and 6. A lenticular part 21 formed in the hinge 3 disperses external force. The case 2 is integrally molded from synthetic material. The biasing members 8, the protrusions 18 and the hooks 17 are bestowed with suitable elasticity.

A piece of an octagonal cylinder of ferrite is axially divided into two pieces of ferrite 7. When the two pieces of ferrite 7 are pushed between the pair of the holding members 12 in the direction A as shown in FIG.

1, the engaging projections 15 and the engaging notches 22 engage and the two pieces of ferrite 7 are settled in the case members 5 and 6.

Figure 8:
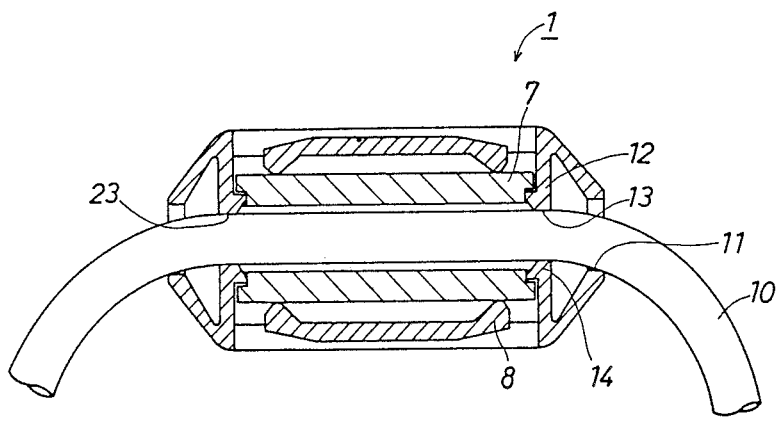
FIG. 8 is a cross-sectional view of the electric noise absorber in use.
Figure 9:
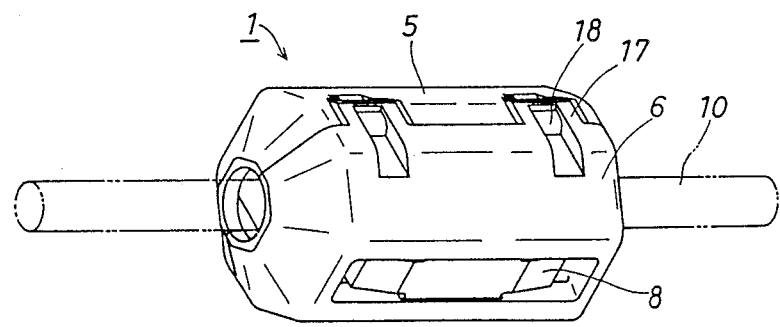
FIG. 9 is a perspective view of the electric noise absorber in use.

As shown in FIGS. 8 and 9, the electric noise absorber 1 is put around an electric cable 10 of the electronic device in the state that the case members 5 and 6 contain the two pieces of ferrite 7, respectively.

When the case members 5 and 6 are closed, the six teeth 14 on the abutment faces 13 of the case members 5 and 6 are arranged in a circle, forming a hole 23 through which the electric cable 10 passes, as shown in FIG. 8. On the other hand, the two semicircle openings 11 form a hole larger than the hole 23. Therefore, the electric cable 10 is retained securely at the holes 23 by the teeth 14 and is held loosely at the openings 11 at the same time. In addition, since the protrusions 18 engage with the hooks 17 and the biasing members 8 press the two pieces of ferrite 7 against each other, the pieces of ferrite 7 placed at their appropriate positions effectively absorb the electric noise.

The electric noise absorber 1 with the structure described above produces the effects explained below.

An adequate number of the electric noise absorber 1 each containing the two pieces of ferrite 7, which is put around the electric cable 10, attenuates the electric noise entering into the electronic device via the electric cable 10.

The electric cable 10 is secured by the elastic holding members 12 and is also held loosely at the openings 11. Consequently, the electric cable 10 is bent slightly between the hole 23 and the opening 11 and also in the outside of the opening 11 by the external force. In brief, the electric noise absorber 1 prevents the electric cable 10 from being damaged by curving sharply in the neighborhood of openings 11 of the case members 5 and 6.

When the external force is exerted on the electric cable 10 in the axial direction, the force is absorbed by the elastic holding members 12 without giving bad influence on the electric noise absorber 1; that is to say, the electric noise absorber 1 is not broken nor are the pieces of ferrite 7 moved.

Although ferrite does not bear external force well and chips easily, it is difficult for the two pieces of ferrite 7 of this embodiment accommodated in the case members 5 and 6 to be broken.

The hinge 3 is also durable because the lenticular part 21 in the hinge 3 disperses the external force produced when the electric noise absorber 1 is opened or closed.

Moreover, the electric noise absorber 1 may be installed on electric cables of various diameters. Specifically, when the diameter of the electric cable 10 is wider than that of the hole 23, the tips of the holding members 12 are axially inclined and the abutment faces 13 are deformed to fit the periphery of the electric cable 10 so as to take hold of the electric cable 10.

The electric noise absorber 1 is put together and taken apart by simple operations; the two pieces of ferrite 7 are attached to the case members 5 and 6 simply by being inserted between the holding members 12, and detached from the case members 5 and 6 by widening the elastic holding members 12.

In order to change the position of the electric noise absorber 1 or detach it from the electric cable 10, the hooks 17 of the case members 6 are simply pulled to disengage them from the protrusions 18.

Next, the second embodiment of this invention is explained.

Figure 10:
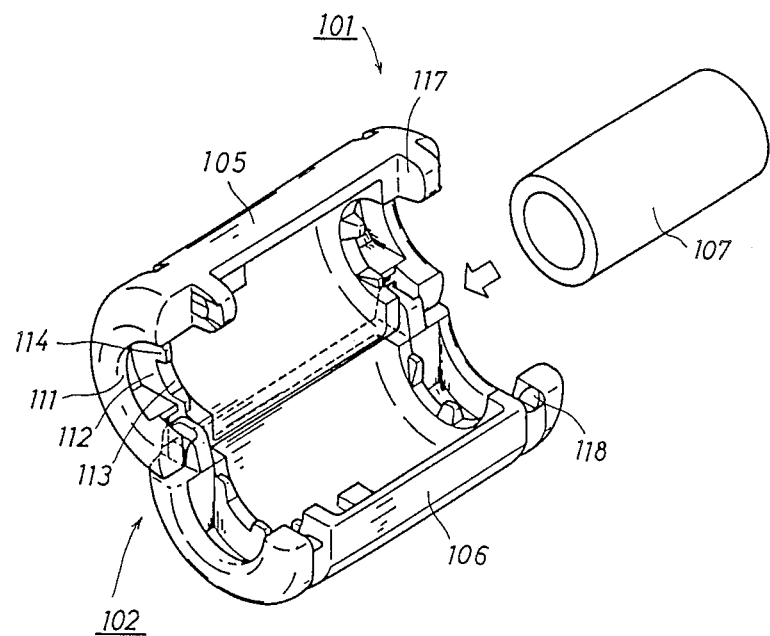
FIG. 10 is a perspective view of an electric noise absorber of a second embodiment.

An electric noise absorber 101 of this embodiment comprises, as shown in FIG. 10, an openable case 102 whose case members 105 and 106 have a half-cylindrical shape in the longitudinal direction. Inside of openings 111 formed at both ends of the case members 105 and 106, holding members 112 are provided so as to keep the electric cable (not shown) in position. Abutment faces 113 on the holding members 112 are shaped in a semicircle to fit the periphery of the electric cable. Two teeth 114 are positioned on each of the abutment faces 113. A cylindrical piece of ferrite 107 is accommodated between the two pairs of holding members 112 of the case members 105 and 106. A pair of half-cylindrical piece of ferrite may be utilized instead of the cylindrical piece of ferrite 107.

A pair of hooks 117 provided on the case member 105 engage with a pair of protrusions 118 provided on the case member 106 so that the case 102 may be closed.

The electric noise absorber 101 is bestowed with durability along with other characteristics similar to those of the electric noise absorber 1 of the first embodiment. Specifically, since being rotatably connected, the electric noise absorber 101 is prevented from being damaged by opening and closing operations.

Figure 11:
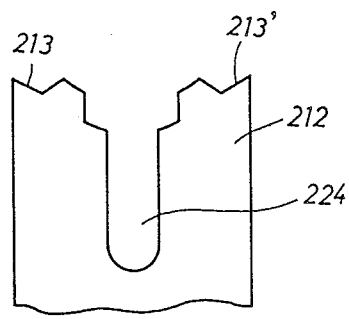
FIG. 11 is a front view of an electric noise absorber of a third embodiment.

The third embodiment of this invention is illustrated in FIG. 11. A slit 224 is formed between abutment faces 213 and 213' of each of the holding members 212 so that the abutment faces 213 and 213' may be deformed in the direction orthogonal to the axis of the case 2, namely, in the horizontal direction in FIG. 11. The slit 224 is cut out in U-shape, V-shape, Y-shape, or the like.

Although specific embodiments of the invention have been shown and described for the purpose of illustration, it should be understood that the invention is not limited to the embodiments illustrated and described. This invention includes all embodiments and modifications that come within the scope of the claims.

For example, hard ferrite, soft ferrite, plastic magnet molded from plastics and particles of magnetic substance including ferrite, or rubber magnet molded from synthetic resin and particles of magnetic substance are utilized as the piece or pieces of ferrite. Furthermore, a variety of magnetic substance including permalloy and thermalloy may be used. Conductive material such as silicon steel is also utilized as magnetic substance because the case members 5, 6, 105 and 106 function as insulating material.

What is claimed is:

1. A noise absorber for absorbing electric noise on a cable comprising:
 a body of magnetic substance formed such that it can surround the cable; and
 first and second case members for holding the body around the cable, where the case members are rotatably attached to each other so that the case members may rotate from an open position to a closed position in which the two case members form a case around the body, the first and second case members having
 two holding members inside each of the first and second case members, where each holding member in the first case member abuts one of the holding members in the second case member and the cable passes through and is held by two holes, one hole being defined by each pair of abutting holding members when the case members are in the closed position, and two wall members on each of the first and second case members, where each wall member on the first case member abuts a wall member on the second case member, the cable passes through two openings, one opening being defined by each pair of abutting wall members when the case members are in the closed position, and the openings have greater diameters than the holes; where the body, the two pairs of abutting holding members, and the two pairs of abutting wall members are spaced along the axis of the cable such that the body is located between the two pairs of abutting holding members and each pair of abutting wall members is located outside the two pairs of abutting holding members, one pair of abutting wall members on either side of the body.

2. The noise absorber of claim 1, wherein the diameter of the holes is slightly larger that the diameter of the cable, and a plurality of teeth located on the holding members protrude into the holes for contacting the cable.

3. The noise absorber of claim 2, wherein the holding members are resiliently attached inside the case members such that the holding members may deflect along the axis of the cable.

4. The noise absorber of claim 3, wherein:

the magnetic body is divided into two magnetic pieces, with grooves cut in each magnetic piece; and each magnetic piece, is securely held in one of the case members such that the cable can be inserted into either of the grooves when the case members are in the open position and the cable can be surrounded by the two magnetic pieces when the case members are in the closed position.

5. The noise absorber of claim 4, wherein the two case members are rotatably attached to each other by a resilient plastic hinge having a lenticular member formed thereon.

6. The noise absorber of claim 5, wherein:

at least one protrusion is located on the first case member and at least one hooking means is located on the second case member for engaging said protrusion to lock the two case members together when the case members are in the closed position; and biasing means are formed on the inside of the case members for forcing the two magnetic pieces together when the case members are in the closed position.

7. The noise absorber of claim 3, wherein a semi-circular opening is defined in each holding member and abutment surfaces are located on the holding members on both sides of the semi-circular opening, where the abutment surfaces of each holding member in the first case member contact the abutment surfaces of one of the holding members in the second case member such that the semi-circular openings in each pair of abutting holding members form the holes.

8. The noise absorber of claim 6, wherein a slit is formed in each holding member between the abutment surfaces such that the holding members may deflect orthogonal to the axis of the cable.

* * * * *